US 6,650,215 B1

(12) United States Patent
Gundale

(10) Patent No.: US 6,650,215 B1
(45) Date of Patent: Nov. 18, 2003

(54) FINNED HEAT SINKS

(75) Inventor: Benjamin P. Gundale, St. Louis Park, MN (US)

(73) Assignee: The Bergquist Company, Chanhassen, MN (US)

( * ) Notice: Subject to any disclaimer, the term of this patent is extended or adjusted under 35 U.S.C. 154(b) by 0 days.

(21) Appl. No.: 10/172,877

(22) Filed: Jun. 17, 2002

(51) Int. Cl.⁷ .............................................. H01F 27/08
(52) U.S. Cl. ....................................... 336/61; 165/80.3
(58) Field of Search ................. 336/55–61; 29/602.1, 29/713, 714, 832, 890.03, 825, 840; 165/185, 80.3

(56) References Cited

U.S. PATENT DOCUMENTS

| 5,533,257 A | * | 7/1996 | Romero et al. | 29/890.03 |
| 5,653,280 A | * | 8/1997 | Porter | 165/80.3 |
| 5,791,406 A | * | 8/1998 | Guner et al. | 165/185 |
| 6,098,279 A | * | 8/2000 | Lee | 29/832 |

FOREIGN PATENT DOCUMENTS

JP          8-130274       *   5/1996

* cited by examiner

*Primary Examiner*—Tuyen T. Nguyen
(74) *Attorney, Agent, or Firm*—Haugen Law Firm PLLP

(57) ABSTRACT

A method of enhancing the heat dissipating properties of a rigid substrate plate through creation of an array of erect spaced-apart parallely disposed metallic fins projecting from the heat dissipating surface of the plate. The fins are created by superimposing a sheet of metallic foil upon a metallic plate, with the foil being bonded to the plate by welding utilizing ultrasonic energy. The welds are formed as spaced-apart parallel bands, with the foil being slit adjacent one edge of the band, with the foil thereafter being folded outwardly to form the heat dissipating metallic foil fins. The folding operation is undertaken following the steps of populating the substrate, thereby eliminating the requirement for unusual steps or precautions to protect what otherwise would be outwardly extending metallic fins.

1 Claim, 3 Drawing Sheets

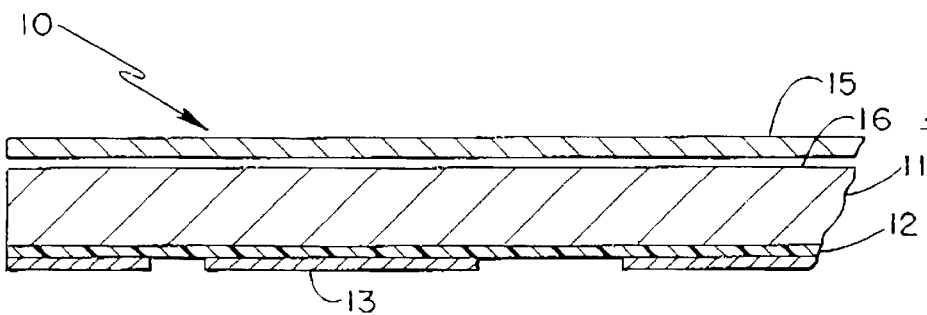
*Fig.-1*
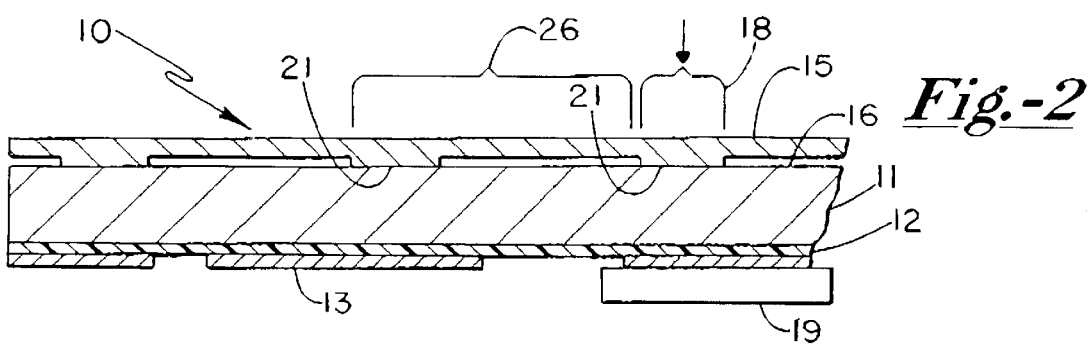
*Fig.-2*
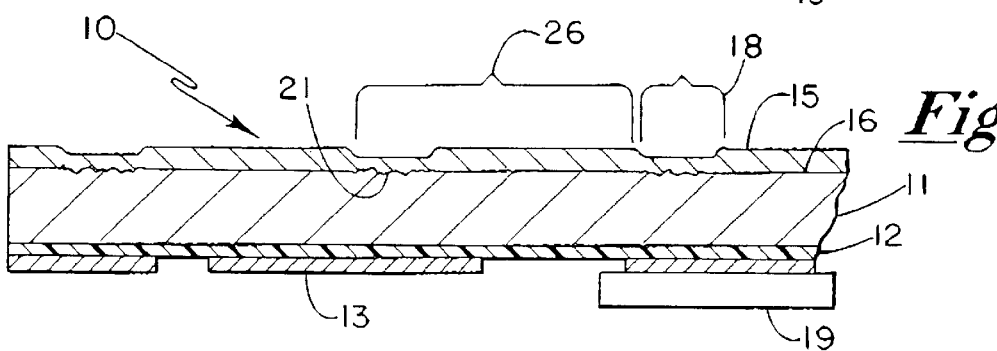
*Fig.-3*
*Fig.-4*
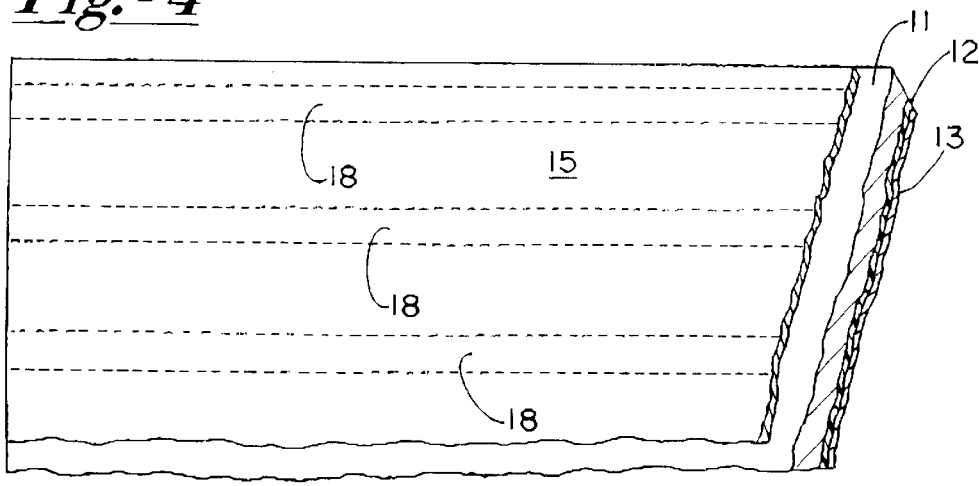

FINNED HEAT SINKS

BACKGROUND OF THE INVENTION

The present invention relates generally to an improved substrate for heat generating electronic and/or semiconductor devices and assemblies, and more particularly to an improved heat dissipating finned substrate for such devices and assemblies. The substrate comprises a metallic plate having a plurality of parallelly disposed fins projecting away from the surface and being weldably secured thereto. The substrate blank is formed, populated, and otherwise completed prior to final deployment of the fins so as to permit normal production techniques to be practiced, and without requiring special techniques and/or devices to avoid handling interference from the fins. In the course of the process of the present invention, an array of spaced parallelly disposed undeployed fin members are created on the heat dissipating surface of a rigid substrate, with the substrate blank thereafter being subjected to various assembly operations including the steps of treating the mounting surface and circuitry and also populating the substrate; all prior to deployment or extension of the fins. Accordingly, the substrate blanks of the present invention may be subjected to conventional assembly operations including that of treating the mounting surface and populating the substrate without requiring unusual steps or precautions to be taken to protect the configuration of outwardly extending metallic fins.

In order to enhance the thermal performance of substrate assemblies, metallic fins have typically been added to provide additional surface area for dissipation of thermal energy. The utilization of fins provides an additional mechanism for conducting heat away from the substrate member by providing substantially greater surface areas. However, in doing so, conventional assembly steps and/or operations are impeded or slowed whenever efforts are undertaken to perform work on a finned device, or alternatively to undertake to attach fins to an already-populated support. Because of the nature of the circuit packages or other components present on a populated circuitry surface, it is accepted that post-attachment of finned members is normally achieved by steps and/or operations which result in the finned members delivering poor thermal performance. For that reason, therefore, finned substrates have met with limited application in the industry.

SUMMARY OF THE INVENTION

In accordance with the present invention, an improved outwardly projecting finned heat dissipating substrate is created utilizing preformed fins in a nondeployed configuration, with these fins being weldably secured to the substrate plate or blank prior to deployment. The welded attachment provides enhanced thermally conductive properties for the final product. In addition, the structure of the present invention is arranged such that the fins remain undeployed and coplanar with the substrate until the steps of mounting of the circuit package, semiconductor devices, or other components onto the surface of the substrate is complete. Thereafter, and as a final or near final operation, the fins are deployed so as to be disposed substantially normal to the plane of the substrate. In other words, because of the novel techniques employed in securing or bonding the fin members to the substrate, the extended or deployed portions of the fins not only remain coplanar with the substrate during the fabrication and assembly operations, but the welded joint provides a highly thermally conductive bond. Since the actual deployment of the fins is undertaken as one of the final steps in the overall operation, assembly proceeds through the production using conventional operations unimpeded by the necessity of protecting or isolating the welded fins during the actual production/assembly steps.

In a typical procedure, a thin metallic sheet or foil is superimposed onto the metallic base surface of a substrate blank in order to create a preform assembly. Thereafter, the preform is interposed into a work station created between the energy delivery horn of an ultrasonic energy generator and a stable anvil, with the energy delivery horn being in surface-to-surface contact with the sheet or foil. An appropriate welding force is applied against the delivery horn while the ultrasonic generator is energized, with the preform being advanced through the work station at a work compatible with formation of continuous, uniform, and integral welded bands. The welding steps are repeated, as necessary, in order to create plural parallel spaced apart welded bands. It is frequently desirable to utilize multiple energy delivery horns in order to create multiple bands in a single pass, thereby reducing the number of repeat welding operations. Thereafter, the metallic sheet/foil is severed adjacent the same edge surface of each welded band to create unattached metallic sheet/foil spans between mutually adjacent welded bands. Either prior to or subsequent to the severing operation, the semiconductor or circuit package mounting surface is treated, undergoing such operations as creation or refinement of circuitry, device populating steps, and the like. Thereafter, and as a final or near-final operation, the foil spans are folded outwardly until they project normally to the plane of the substrate blank.

Therefore, it is a primary object of the present invention to prepare improved fin heat sinks, with the fins being weldably attached to the surface of the substrate/sink, and deployed to project outwardly as a final or near-final operation.

It is a further object of the present invention to provide an improved technique for the fabrication of finned heat sinks for semiconductor devices, wherein the sinks are provided with metallic fins projecting outwardly from the surface, and with the fins being weldably attached through ultrasonic welding techniques so as to achieve enhanced heat dissipating qualities and characteristics.

Other and further objects of the present invention will become apparent to those skilled in the art upon a study of the following specification, appended claims, and accompanying drawings.

IN THE DRAWINGS

FIG. 1 is a side elevational view of an insulated metal substrate base plate having a pair of opposed major surfaces, one surface of which is adapted to support an electronic heat generating device, the other surface having a thin metallic sheet superimposed thereon and from which finned projections will be formed following welded attachment and slitting steps being performed;

FIG. 2 is a demonstrative view similar to FIG. 1 and illustrating the configuration of the components of FIG. 1 subsequent to attachment of the thin metallic sheet to the base plate through the formation of welded bands or strips at the mating surfaces, with certain of the components of the arrangement being shown in exaggerated form in order to better illustrate features of the invention;

FIG. 3 is a view of the components illustrated in FIG. 2, but more realistically showing the subassembly and its configuration;

FIG. 4 is a fragmentary top plan view of the subassembly of FIG. 3 broken away;

DESCRIPTION OF THE PREFERRED EMBODIMENT

Figure 5:
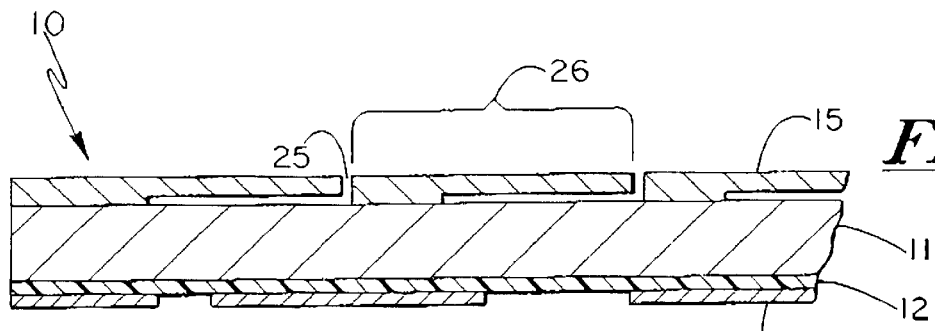
FIG. 5 is a demonstrative view similar to FIG. 2 and illustrating the configuration of the components of FIGS. 1 and 2 subsequent to the slitting steps being undertaken on the thin metallic sheet component.
Figure 6:
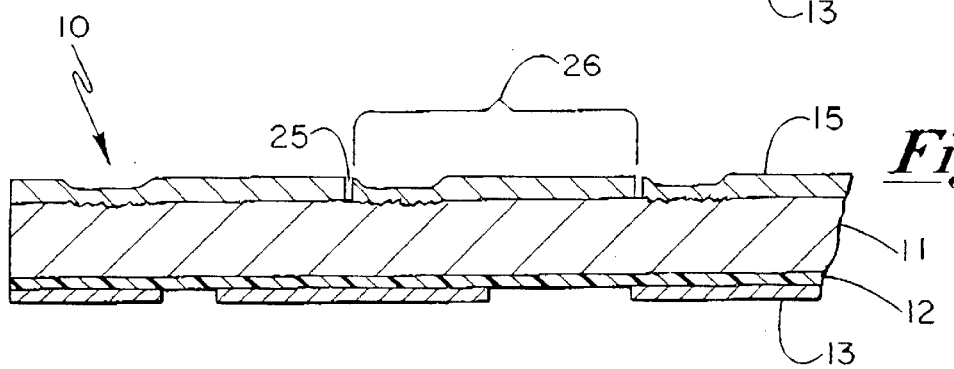
FIG. 6 is a view of the components illustrated in FIG. 5, but showing the subassembly configuration more realistically following the slitting step as illustrated in FIG. 5.
Figure 7:
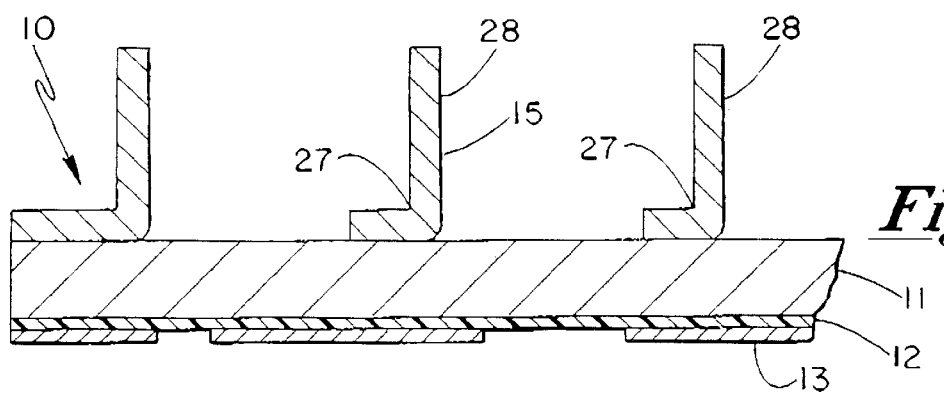
FIG. 7 is a demonstrative view similar to FIGS. 2 and 5 and illustrating the configuration of the components following folding of the fins away from the plane of the substrate base plate.
Figure 8:
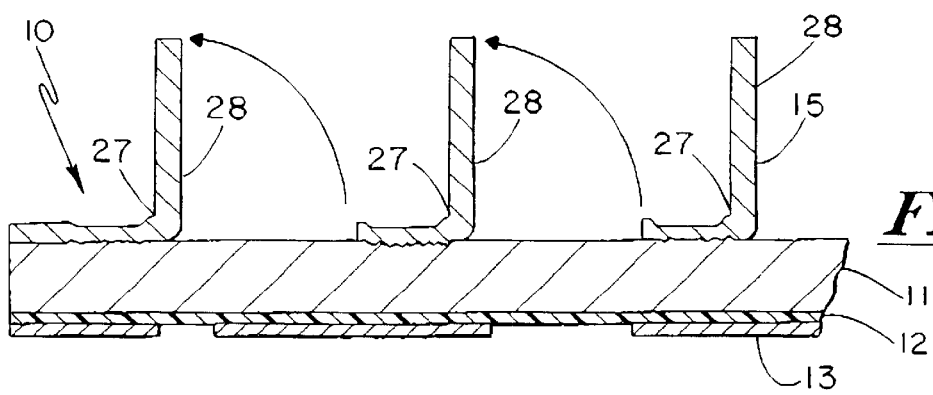
FIG. 8 is a view of the components illustrated in FIG. 7, but showing the assembly with the fins being folded to project normally from the plane of the substrate base plate.
Figure 9:
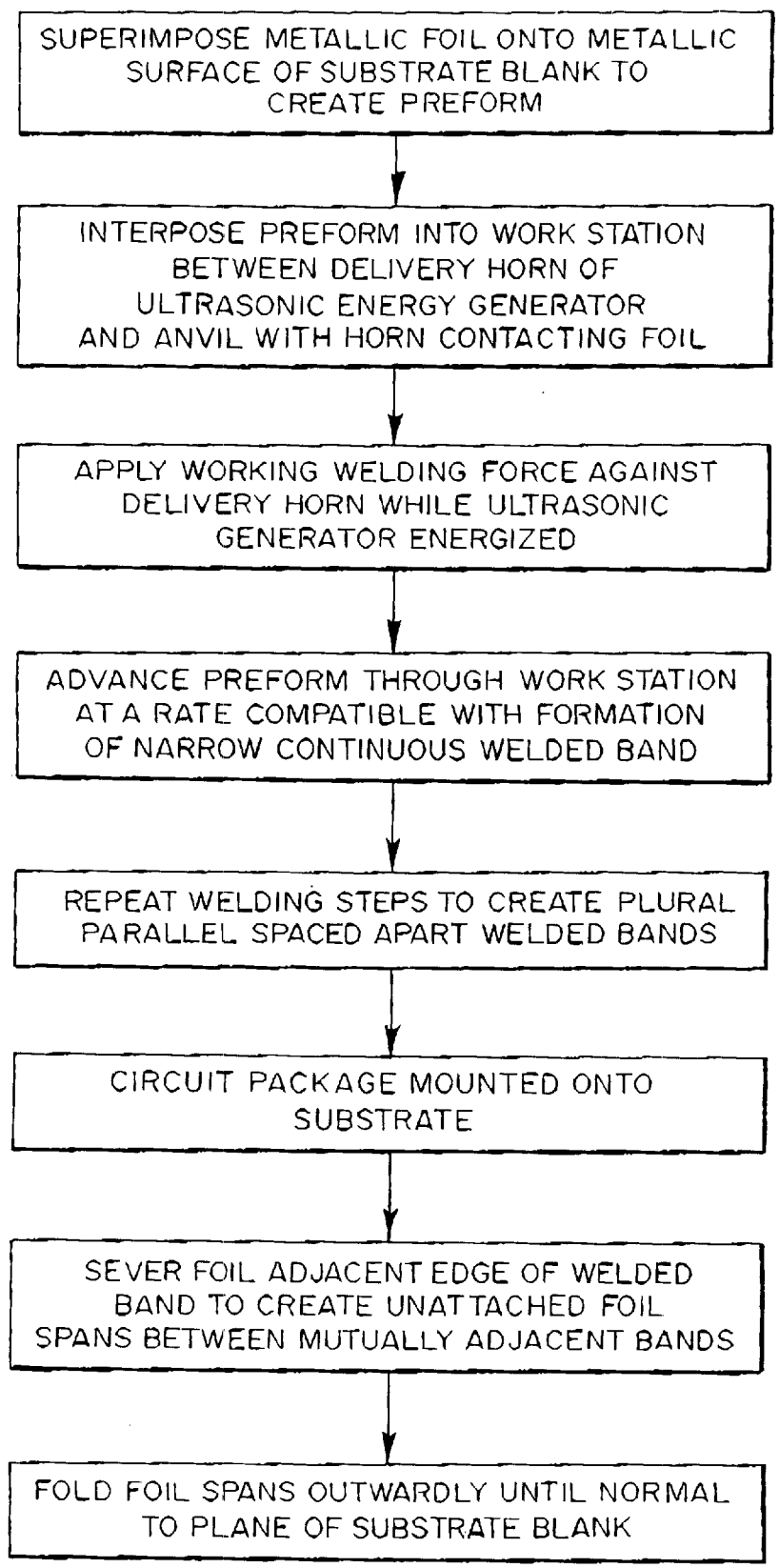
FIG. 9 is a flow chart illustrating a typical sequence of steps undertaken in practicing the steps or operations involved in the process of the present invention.

In accordance with the preferred embodiment of the present invention, and with particular attention being directed to FIG. 1 of the drawings, a subassembly generally designated 10 is illustrated with the subassembly including a rigid metallic aluminum substrate base plate 11 having a dielectric surface 12 bonded to one major surface thereof. Circuit foil 13 is bonded or otherwise secured to the surface of dielectric 12 to complete the basic configuration of the support for a heat generated semiconductor device (not shown). A thin aluminum metallic sheet 15 is superimposed upon major surface 16 of rigid substrate plate 11, with the thin metallic sheet 15, while in superimposed relationship to surface 16, together with the substrate 11 creating a preform. Dielectric 12 is a plastic resinous material which is electrically insulative such as for example epoxy or polyester-based materials which may be filled and/or reinforced, these materials being well known in the art and used as substrate components.

The preform is placed in working relationship with the energy delivery horn of an ultrasonic generating system, with the horn being illustrated partially in phantom in FIG. 2, as at 18. Ultrasonic generating systems adapted for ultrasonic welding of metals such as aluminum are, of course, commercially available, with one such system being identified under the trade designation "Ultraseam-20", and offered commercially by American Technology, Inc. of Shelton, Conn. In oppositely disposed relationship to ultrasonic energy delivery horn 18 is a stable anvil support 19, which is designed to be sufficiently durable and rigid to provide a work support for the preform of subassembly 10. The combination of the ultrasonic energy delivery horn 18 and anvil support 19 create a work station for the welding operation. Support anvils for this purpose are, of course, commercially available and known to those of conventional skill.

In the welding operation, the energy delivery horn 18 is placed into contact with the exposed surface of metallic foil 15 in opposed relationship to work receiving anvil 19 to provide the desired area or surface contact between the delivery horn and the metallic sheet/foil at the predetermined contact point or site. A force sufficient to create a working welding pressure at the sheet/plate interface is established and maintained, with this working force and ranges being known to those of skill. When energized, the ultrasonic vibratory energy dispatched by horn 18 to the site provides the energy and force to create the heat necessary to form the uniform welded zone between the surface of aluminum substrate plate 11 and thin aluminum sheet 15. By way of typical examples, plate 11 will have a thickness dimension ranging from between about 40 and 200 mils, with metallic sheet 15 having a thickness ranging from between about 10 and 20 mils. For most purposes, a range of between about 60 and 120 mils for plate 11 and between about 12 and 15 mils for sheet 15 is highly useful.

In order to provide or form the elongated strip bonds such as illustrated at 21—21 between plate 11 and sheet 15, continuous relative motion is provided by drawing and/or moving the preform through the work station in order to create the narrow elongated welded band across the entire width of the substrate 11 within the preform and/or assembly 10. Welded bands having a width of about one-eighth inch, with bands spaced about one-inch on center have been found to be highly useful for a host of applications. Bands spaced from between one-half inch and one-inch on center have been found useful.

With attention now being directed to FIG. 3 of the drawings, it will be observed that cuts as at 25 are formed along each of the first lateral edge surfaces of a plurality of mutually adjacent welds to form welded foil platelets as at 26. Following formation of the platelets, and as indicated in FIG. 4, the platelets are folded as at 27 so as to form fins 28—28 which project normally outwardly from the surface of substrate plate 11. Thereafter, the device is provided with a family of parallelly disposed spaced apart heat dissipating metallic foil fins 28—28.

With this configuration in mind, it will be noted that semiconductor devices may be treated and/or populated onto the insulative surface as at 13 of preform and/or assembly 10. Among the operations that may be conducted prior to the folding and/or sheet severing operations are circuit line definition and/or delineation, mounting of semiconductor devices, as well as surface mounting of other components which may be utilized in the overall finished device contemplated. In this arrangement, therefore, fins 28—28 are neither deployed and/or erected until the final stages of the overall operation, thereby rendering the substrate plate more readily usable in conventional production operations.

As a further advantage of the arrangement of the present invention, the individual steps are undertaken prior to mounting and/or populating the active surface of the assembly. Thus, the semiconductor devices and other components are not subjected to the conditions which may be employed in fastening, securing, or bonding heat dissipating fins to the surface of a substrate.

It will be appreciated that the examples given herein are for purposes of illustration only and are not to be construed as a limitation upon the scope of the invention, with the scope being set forth in the appended claims.

What is claimed is:

1. The method of enhancing the heat dissipating properties of a rigid substrate plate through creation of an array of erect spaced apart parallelly disposed metallic fins projecting from the heat dissipating surface of the rigid substrate plate, with the plate having first and second opposed major surfaces, the first major surface supporting a heat generating semiconductor device, and with said second major surface having said projecting metallic fins weldably attached thereto, said method comprising the steps of:

(a) placing a sheet of metallic foil in superimposed relationship to the heat dissipating surface of said substrate plate to create a preform;

(b) placing the energy delivery horn of an ultrasonic generating system in closely spaced opposed relationship to the work-receiving surface of a stable anvil to create an ultrasonic welding station;

(c) placing said preform within said work station with the semiconductor supporting surface of said preform positioned against said work-receiving surface;

(d) bringing said energy delivery horn into contact with the metallic foil surface of said preform in opposed relationship to said work-receiving anvil surface to provide relatively short line contact between said delivery horn and said metallic foil surface at a predetermined contact site;

(e) applying a force sufficient for creating a working welding pressure at the foil/plate interface of said preform;

(f) coupling an ultrasonic energy generator to said delivery horn for application of vibratory energy at ultrasonic frequencies to said metallic foil at said selected site until said foil/plate interface forms a welded strip bond with laterally spaced apart first and second edges;

(g) providing continuous relative motion between said preform and said work station to create a relatively narrow elongated welded band across the width of said substrate;

(h) severing said foil along each of said first lateral edge surfaces to form a plurality of mutually adjacent welded foil platelets; and (i) folding each of said foil platelets along said second lateral edge surface to form a family of parallelly disposed spaced-apart heat dissipating metallic foil fins.

* * * * *